United States Patent
Xie

(10) Patent No.: US 12,260,807 B2
(45) Date of Patent: Mar. 25, 2025

(54) DISPLAY DEVICE WITH IMPROVED REFLECTIVE DISPLAY UNDER INSUFFICIENT ILLUMINATION OF AMBIENT LIGHT

(71) Applicant: Shanghai Tianma Micro-Electronics Co., Ltd., Shanghai (CN)

(72) Inventor: Mengmeng Xie, Xiamen (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 79 days.

(21) Appl. No.: 17/968,480

(22) Filed: Oct. 18, 2022

(65) Prior Publication Data

US 2024/0005844 A1    Jan. 4, 2024

(30) Foreign Application Priority Data

Jun. 30, 2022  (CN) .......................... 202210758657.9

(51) Int. Cl.
| | |
|---|---|
| *G09G 3/32* | (2016.01) |
| *G09G 3/3208* | (2016.01) |
| *H01L 25/075* | (2006.01) |
| *H01L 25/16* | (2023.01) |
| *H01L 33/60* | (2010.01) |

(52) U.S. Cl.
CPC ............. *G09G 3/32* (2013.01); *G09G 3/3208* (2013.01); *H01L 25/0753* (2013.01); *H01L 25/167* (2013.01); *H01L 33/60* (2013.01); *G09G 2300/023* (2013.01); *G09G 2360/144* (2013.01)

(58) Field of Classification Search
CPC ....................................................... G09G 3/32
See application file for complete search history.

(56) References Cited

U.S. PATENT DOCUMENTS

| | | | | |
|---|---|---|---|---|
| 10,879,217 | B1* | 12/2020 | Li | ......... H01L 25/0753 |
| 2004/0113877 | A1* | 6/2004 | Abileah | ............... G09G 3/3648 |
| | | | | 345/92 |
| 2015/0373793 | A1* | 12/2015 | Bower | ..................... H01L 33/48 |
| | | | | 362/20 |
| 2016/0253965 | A1* | 9/2016 | Rappoport | ........... H10K 59/121 |
| | | | | 345/694 |

(Continued)

FOREIGN PATENT DOCUMENTS

| | | |
|---|---|---|
| CN | 101004505 A | 7/2007 |
| CN | 109461380 A | 3/2019 |

*Primary Examiner* — Dorothy Harris
*Assistant Examiner* — Andrew B Schnirel
(74) *Attorney, Agent, or Firm* — Anova Law Group, PLLC

(57) ABSTRACT

A display device is provided. The display device includes a first display panel and a second display panel stacked in a first direction. The first display panel includes a first substrate, and light-emitting units on a side of the first substrate away from the second display panel. The light-emitting units include first light-emitting units and second light-emitting units. One first light-emitting unit includes a first light-emitting layer, and a distance between the first light-emitting layer and the first substrate in the first direction is D1. One second light-emitting unit includes a second light-emitting layer, and a distance between the second light-emitting layer and the first substrate in the first direction is D2, where D1>D2. The second display panel includes a reflective surface on a side of the first substrate away from the light-emitting units.

19 Claims, 17 Drawing Sheets

(56) References Cited

U.S. PATENT DOCUMENTS

| | | | |
|---|---|---|---|
| 2018/0174519 A1* | 6/2018 | Kim | H01L 27/156 |
| 2018/0190747 A1* | 7/2018 | Son | G06F 3/1446 |
| 2020/0393724 A1* | 12/2020 | Li | G09G 3/32 |
| 2021/0126080 A1* | 4/2021 | Kim | H10K 59/131 |
| 2021/0328116 A1* | 10/2021 | Li | H01L 33/62 |

* cited by examiner

DISPLAY DEVICE WITH IMPROVED REFLECTIVE DISPLAY UNDER INSUFFICIENT ILLUMINATION OF AMBIENT LIGHT

CROSS-REFERENCE TO RELATED APPLICATION

This application claims the priority of Chinese Patent Application No. 202210758657.9, filed on Jun. 30, 2022, the content of which is incorporated herein by reference in its entirety.

TECHNICAL FIELD

The present disclosure generally relates to the field of display technologies and, more particularly, relates to a display device.

BACKGROUND

As science and technology continuously develop, various display devices have been widely used in people's daily life and work, bringing great convenience to people's life.

Among them, a reflective display panel displays images by illumination of external ambient light, which configuration of a light source module can be omitted to improve the lightness and portability of the reflective display panel. An advantage of low energy consumption makes the reflective display panel widely used in products such as electronic papers, electronic books or electronic signages.

Since the reflective display panel needs the illumination of an external light source to generate a display image, its display effect is more easily affected by the external ambient light. For example, in a slightly dim or dark environment, the display image of the reflective display panel may be unclear because of insufficient illumination of the ambient light.

SUMMARY

One aspect of the present disclosure provides a display device. The display device includes a first display panel and a second display panel stacked in a first direction. The first display panel includes a first substrate, and light-emitting units on a side of the first substrate away from the second display panel. The light-emitting units include first light-emitting units and second light-emitting units. One first light-emitting unit includes a first light-emitting layer, and a distance between the first light-emitting layer and the first substrate in the first direction is D1. One second light-emitting unit includes a second light-emitting layer, and a distance between the second light-emitting layer and the first substrate in the first direction is D2, where D1>D2. The second display panel includes a reflective surface on a side of the first substrate away from the light-emitting units.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
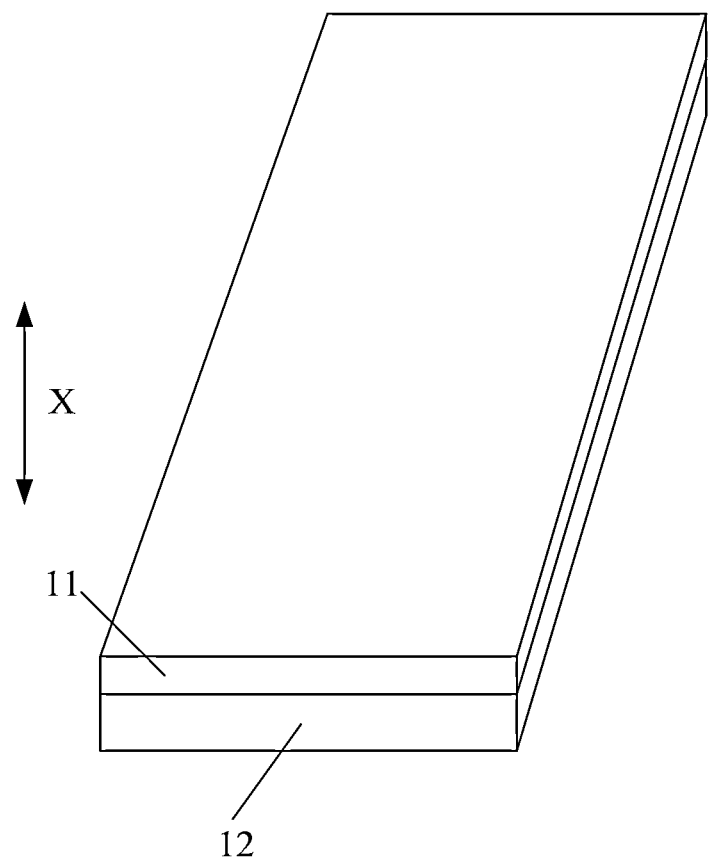
FIG. 1 illustrates a top view of an exemplary display device consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

Most reflective display panels currently on the market are black and white displays. Positively charged white particles and negatively charged black particles move under the action of an electric field to achieve the purpose of display. A reflective display panel needs the illumination of an external light source to produce a display image, which makes its display effect more susceptible to the influence of external ambient light. For example, a display image of the reflective display panel may be not clear because of insufficient illumination of the ambient light in a slightly dim or dark use environment.

To achieve color display, two exemplary methods are mainly adopted in the reflective display panel.

In the first method, a color filter substrate is added to the original black and white display reflective display panel to achieve full-color display. Although the color filter substrate is able to achieve full-color display, the color filter substrate itself has a filter function that will seriously attenuate the light reflected by the reflective display panel such that the display brightness will be significantly reduced, resulting in poor display effect.

In the second one, on the basis of white particles and black particles, electrophoretic particles of different colors are directly added, and full-color display is realized by controlling the proportion of electrophoretic particles of different colors on the reflective surface. In existing technologies, different threshold voltages are needed to control the electrophoretic particles of different colors. That is to say, to achieve full-color display, different threshold voltages are required to correspond to electrophoretic particles of different colors. Obviously, a very complicated driver is required, and it takes about two seconds to complete the display of each image. The resulting full-color display image is ultimately a static full-color display image.

The present disclosure provides a display device to at least partially alleviate the above problems in the reflective display panel.

The present disclosure provides a display device. FIG. 1 illustrates a schematic structure of a display device. In one embodiment, the display device may include a first display panel 11 and a second display panel 12 stacked along a first direction X.

Figure 2:
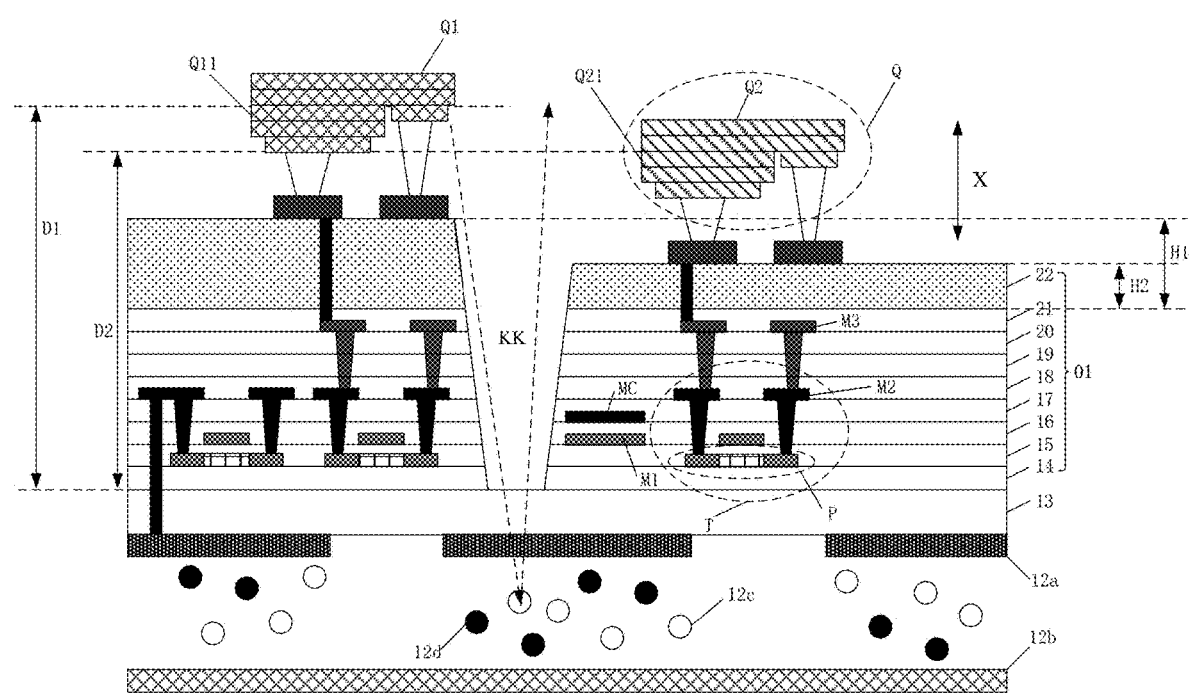
FIG. 2 illustrates a cross-sectional view of an exemplary display device consistent with various disclosed embodiments in the present disclosure.

FIG. 2 illustrates a cross-sectional view of the display device. The first display panel 11 may include a first substrate 13, and light-emitting units Q on a side of the first substrate 13 away from the second display panel 12. The second display panel 12 may include a reflective surface on a side of the first substrate 12 away from the light-emitting units Q.

As shown in FIG. 2, the second display panel 12 may be a reflective display panel, and may further include pixel electrode layers 12a and a common electrode layer 12b. Positively charged white particles 12c and negatively charged black particles 12d may be disposed between the pixel electrode layers 12a and the common electrode layer 12b. A same common voltage may be applied to the common electrode layer 12b, and different threshold voltages may be applied to each of the pixel electrode layers 12a. Under the action of the electric field between the pixel electrode layers 12a and the common electrode layer 12b, the white particles 12c and the black particles 12d may be driven to move. The white particles 12c may reflect light to form a reflective area pattern, and the black particles 12d may absorb light to form an absorbing area pattern, such that the second display panel 12 generates a pattern of reflective areas and absorbing areas to form an image.

For description purposes only, the embodiment where the second display panel 12 adopts the driving form in the above description is used as an example to illustrate the present disclosure, and does not limit the specific display mode of the second display panel 12. In some other embodiments, the second display panel 12 may also be a micro capsule electrophoretic reflective display panel.

As shown in FIG. 2, the light-emitting units Q in the first display panel 11 may include a first light-emitting unit Q1 and a second light-emitting unit Q2. In one embodiment, the first light-emitting unit Q1 may be an LED light-emitting unit, and the second light-emitting unit Q2 may be an LED light-emitting unit or an OLED light-emitting unit. For example, the LED light-emitting unit may be a micro-LED light-emitting unit or a mini-LED light-emitting unit.

For description purposes only, the embodiment where the first light-emitting unit Q1 and the second light-emitting unit Q2 are both LED light-emitting units and the first display panel 11 is a mini-LED display panel is used as an example for illustration. The light-emitting units Q in the first display panel 11 may at least includes a light-emitting unit for emitting red light, a light-emitting unit for emitting green light, and a light-emitting unit for emitting blue light, to realize full-color display of the first display panel.

The first substrate 13 may include but is not limited to a glass substrate or a substrate made of other transparent materials. When the light-emitting units Q are micro-LED light-emitting units, the size of the micro-LED light-emitting units is relatively small, and a part between two adjacent micro-LED light-emitting units shown in FIG. 2 may be used as a transmission area KK. The light emitted by the first light-emitting unit Q1 may be transmitted to the second display panel 12 through the transmission area KK and the transparent material substrate, and the light reflected by the reflective surface of the second display panel 12 may be transmitted to the display surface through the transparent substrate and the transmission area KK.

As shown in FIG. 2, the first display panel 11 may further include: an array layer 01 located between the first substrate 13 and the light-emitting units Q. The array layer 01 may include a buffer layer 14 on the side of the first substrate 13 away from the second display panel 12, an active layer P on a side of the buffer layer 14 away from the first substrate 13, a dielectric layer 15 on a side of the active layer P away from the first substrate 13, a first metal layer 15 on a side of the dielectric layer 15 away from the first substrate 13, a first insulating layer 16 on a side of the first metal layer M1 away from the first substrate 13, a metal layer MC on a side of the first insulating layer 16 away from the first substrate 13, a second insulating layer 17 on a side of the metal layer MC away from the first substrate 13, a second metal layer M2 on a side of the second insulating layer 17 away from the first substrate 13, a third insulating layer 18, a fourth insulating layer 19, and a fifth insulating layer 20, the third metal layer M3 on the side of the fifth insulating layer 20 away from the first substrate 13 sequentially disposed on a side of the second metal layer M2 away from the first substrate 13, and a third metal layer M3 on a side of the fifth insulating layer 20 away from the first substrate 13, a sixth insulating layer 21 on a side of the third metal layer M3 away from the first substrate 13, and a planarization layer 22 on a side of the sixth insulating layer 21 away from the first substrate 13.

In one embodiment, the active layer P may be made of a silicon material or a metal oxide material.

Wiring or thin film transistors T may be formed on the metal layers in the array layer 01 to control the working state of the light-emitting units Q.

In one embodiment shown in FIG. 2, the pixel electrode layers 12a in the second display panel 12 may be located on the side of the common electrode layer 12b close to the first display panel 11, that is to say, the pixel electrode layers 12a may be located close to the array layer 01. This configuration may realize the control of the working state of the light-emitting units Q and the control of the pixel electrode layers 12a through the array layer 01, thereby simplifying the structure of the display device. The pixel electrode layers 12a may be connected to the driving circuits formed by the thin film transistors T in the array layer 01 and used to receive the driving signal.

In other embodiments, the pixel electrode layers 12a may also be located on a side away from the first display panel 11, to reduce the film layers through which the reflected light of the second display panel 12 passes, which is more conducive to the reflective display of the second display panel 12.

Further, as shown in FIG. 2, the first light-emitting unit Q1 may include a first light-emitting layer Q11, and a distance between the first light-emitting layer Q11 and the first substrate 13 in the first direction X may be D1.

The second light-emitting unit Q2 may include a second light-emitting layer Q21, and a distance between the second light-emitting layer Q21 and the first substrate 13 in the first direction X may be D2, where D1>D2.

Figure 3:
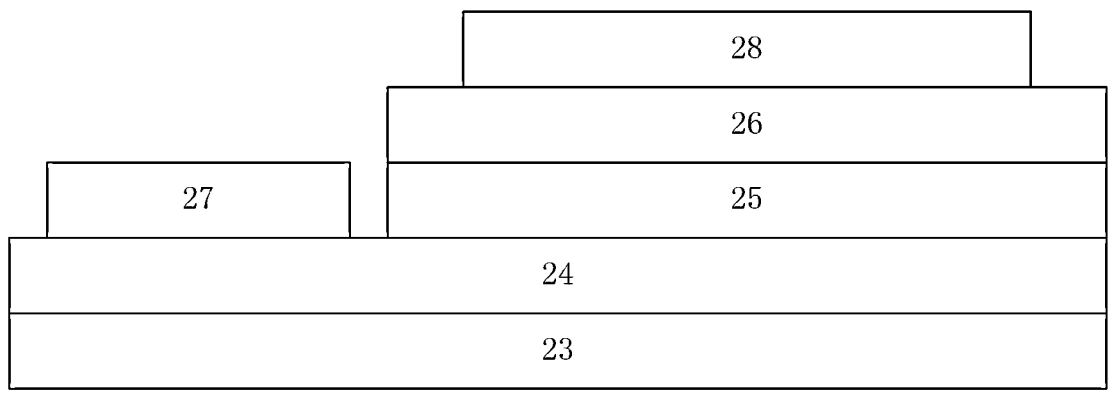
FIG. 3 illustrates an exemplary light-emitting unit consistent with various disclosed embodiments in the present disclosure.

It should be noted that, as shown in FIG. 3 which is a schematic structural diagram of a light-emitting unit provided by an embodiment of the present disclosure, when a light-emitting unit is an LED light-emitting unit, the light-emitting unit Q may include: a substrate 23, an N-type semiconductor layer 24, a multiple quantum well (MQW) layer 25, and a P-type semiconductor layer 26 sequentially disposed on the substrate 23.

A first electrode 27 may be disposed on the N-type semiconductor layer 24, and a second electrode 28 may be disposed on the P-type semiconductor layer 26. That is to say, in the embodiment of the present disclosure, the first electrode 27 may be the N electrode of the light-emitting unit Q, and the second electrode 28 is the P electrode of the light-emitting unit Q.

The substrate 23 may be made of a material including sapphire, aluminum nitride, silicon nitride, or gallium nitride single crystal materials. The N-type semiconductor layer 24 may include but is not limited to an N-type nitride Gallium semiconductor layer, the P-type semiconductor layer 26 may include but is not limited to a P-type gallium nitride semiconductor layer.

It should be noted that in the embodiment of the present disclosure, the light-emitting layer of the light-emitting unit Q may be the MQW layer, that is, the first light-emitting layer Q11 of the first light-emitting unit Q1 may be the MQW layer in the first light-emitting unit Q1, and the second light-emitting layer Q21 of the light-emitting unit Q2 may be the MQW layer in the second light-emitting cell Q2.

In the present disclosure, the first display panel 11 and the second display panel 12 in the display device may be stacked in the first direction X. The reflective surface of the second display panel 12 may be located on the side of the first substrate 13 away from the light-emitting units Q, and the light-emitting units Q may be located on the side of the first substrate 13 away from the second display panel 12. The second display panel 12 may be able to display by reflecting the light of the first light-emitting units Q1 and/or the ambient light transmitted through the first display panel 11. Therefore, in a slightly dim or a dark use environment, the second display panel 12 may be able to display by reflecting the light of the first light-emitting units Q1 to improve the display effect. The distance from the first light-emitting layer Q11 of the first light-emitting unit Q1 in the first display panel 11 to the first substrate 13 in the first direction X may be larger than the distance between the second light-emitting layer Q21 of the second light-emitting unit Q2 and the first substrate 13 in the first direction X. That is, based on the first substrate 13, the height of the first light-emitting unit Q1 may be higher than the height of the second light-emitting unit Q2, which may ensure that the light emitted by the first light-emitting unit Q1 is more easily used by the second display panel 12 for reflection display to further improve the display effect of the second display panel 12 in a slightly dim or dark environment.

Further, since the first display panel 11 itself may be able to realize full-color display, when the display device needs to perform color dynamic display, the first display panel 11 may be in a working state to perform color dynamic display, and the second display panel 12 may be in a non-working state.

Further, considering the problem that one light-emitting unit that emits red light consumes a lot of power when it displays for a long time, when the display device needs to display text and the ambient light is good, the second display panel 12 may be in a working state to reflect the ambient light for display, and the first display panel 11 may be in a non-working state. When text display is required but the external ambient light is not ideal, the first light-emitting unit Q1 in the first display panel 11 may be in a working state, the second light-emitting unit Q2 may be in a non-operating state, and the second display panel 12 may realize display by reflecting the light emitted by the first light-emitting unit Q1 and the external ambient light. Therefore, the display device may be able to meet the excellent display effect based on different display requirements, but also may save power consumption.

In another embodiment as shown in FIG. 2, the array layer 01 may include a first film layer. For description purposes only, the embodiment where the first film layer is the planarization layer 22 is used as an example to illustrate the present disclosure, and does not limit the scope of the present disclosure.

A thickness of a portion of the first film layer overlapping the first light-emitting unit Q1 may be larger than a thickness of another portion of the first film layer overlapping the second light-emitting unit Q2.

As shown in FIG. 2, the thickness of the portion of the first film layer overlapping the first light-emitting unit Q1 may be H1, and the thickness of another portion of the first film layer overlapping the second light-emitting unit Q2 may be H2, where H1>H2. Correspondingly, the distance between the first light-emitting layer Q11 of the first light-emitting unit Q1 and the first substrate 13 in the first direction X in the first display panel 11 may be larger than the distance between the second light-emitting layer 121 of the second light-emitting unit Q2 and the first substrate 13 in the first direction X. That is, the height of the first light-emitting unit Q1 on the first substrate 13 may be higher than the height of the second light-emitting unit Q2, ensuring that the light emitted by the first light-emitting unit Q1 is more easily to be used by the second display panel 12 for reflective display to further improve the display effect of the second display panel 12 in a slightly dim or dark use environment.

In one embodiment, when forming the first film layer, the thickness of the portion of the first film layer overlapping the first light-emitting unit Q1 may be made larger than the thickness of another portion of the first film layer overlapping the second light-emitting unit Q2 by a half-tone mask exposure process. This process obviously may be able to raise the first light-emitting unit Q1 without increasing the manufacturing difficulty of the first display panel 11.

It should be noted that the first film layer may also be another film layer in the array layer 01. For example, it may also be any film layer among the buffer layer, the dielectric layer, and the first to sixth insulating layers. That is, an existing film layer in the array layer 01 may be improved such that the thickness of the portion of the film layer overlapping the first light-emitting unit Q1 is larger than the thickness of the portion of the film layer overlapping the second light-emitting unit Q2, to raise the first light-emitting unit Q2.

Figure 4:
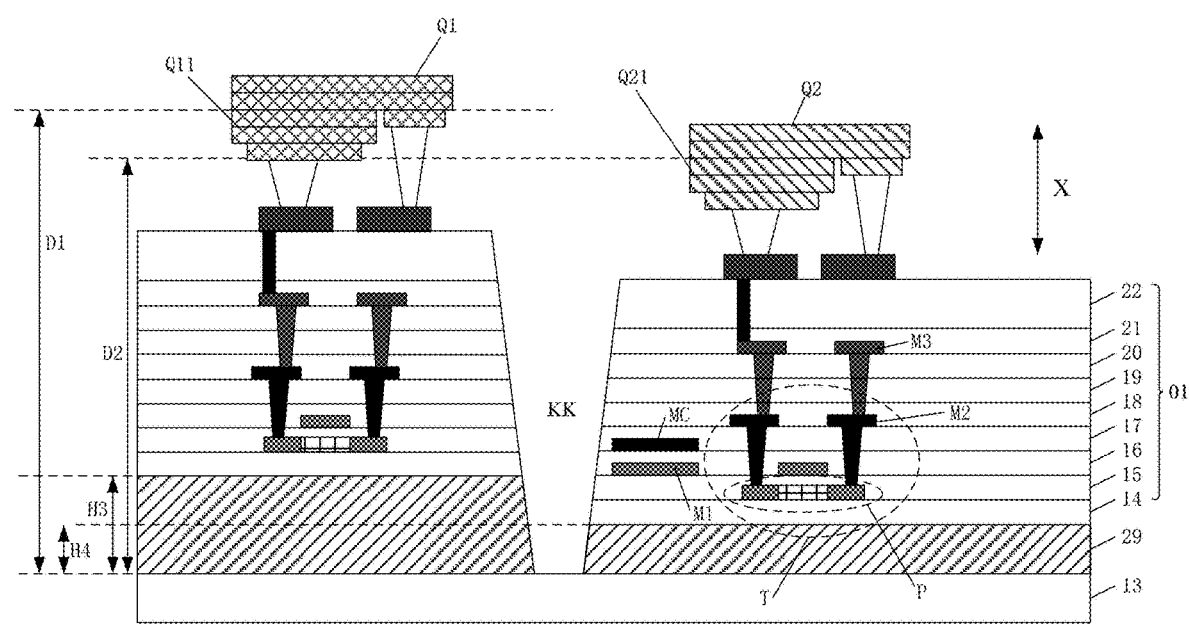
FIG. 4 illustrates an exemplary first display panel consistent with various disclosed embodiments in the present disclosure.
Figure 5:
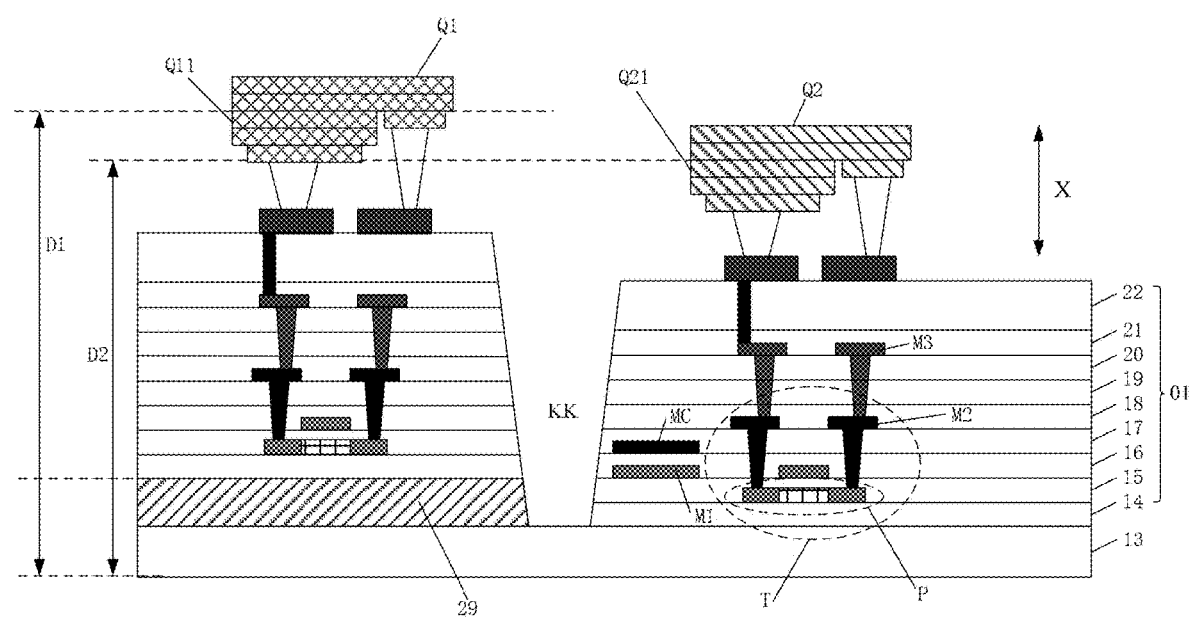
FIG. 5 illustrates a cross-sectional view of an exemplary first display panel consistent with various disclosed embodiments in the present disclosure.

In another embodiment shown in FIG. 4 which is a schematic cross-sectional view of a first display panel and FIG. 5 which is a schematic cross-sectional view of another first display panel, the first display panel 11 may further include a second film layer 29 between the array layer 01 and the first substrate 13.

As shown in FIG. 4, In one embodiment, a thickness of a portion of the second film layer 29 overlapping the first light-emitting unit Q1 in the first direction X may be larger than a thickness of another portion of the second film layer 29 overlapping the second light-emitting unit Q2.

In another embodiment, as shown in FIG. 5, in the first direction X, the first light-emitting unit Q1 and the second film layer 29 may overlap, and the second light-emitting unit Q2 and the second film layer 29 may not overlap.

As shown in FIG. 4, the second film layer 29 may be disposed between the array layer 01 and the first substrate 13. The thickness of the portion of the second film layer 29 overlapping the first light-emitting unit Q1 in the first direction X may be H3, and the thickness of the portion of the second film layer 29 overlapping the second light-emitting unit Q2 may be H4, where H3>H4. Correspondingly, the distance between the first light-emitting layer Q11 of the first light-emitting unit Q1 and the first substrate 13 in the first direction X in the first display panel 11 may be larger than the distance between the second light-emitting layer Q21 of the second light-emitting unit Q2 and the first substrate 13 in the first direction X. That is, the height of the first light-emitting unit Q1 on the first substrate 13 may be higher than the height of the second light-emitting unit Q2, ensuring that the light emitted by the first light-emitting unit Q1 is more easily to be used by the second display panel 12 for reflective display to further improve the display effect of the second display panel 12 in a slightly dim or dark use environment.

In one embodiment shown in FIG. 4, the second film layer 29 may be an integral film layer. When forming the second film layer 29, the thickness of the portion of the second film layer 29 overlapping the first light-emitting unit Q1 may be made larger than the thickness of another portion of the second film layer 29 overlapping the second light-emitting unit Q2 by a half-tone mask exposure process. This process obviously may be able to raise the first light-emitting unit Q1 without increasing the manufacturing difficulty of the first display panel 11.

Figure 6:
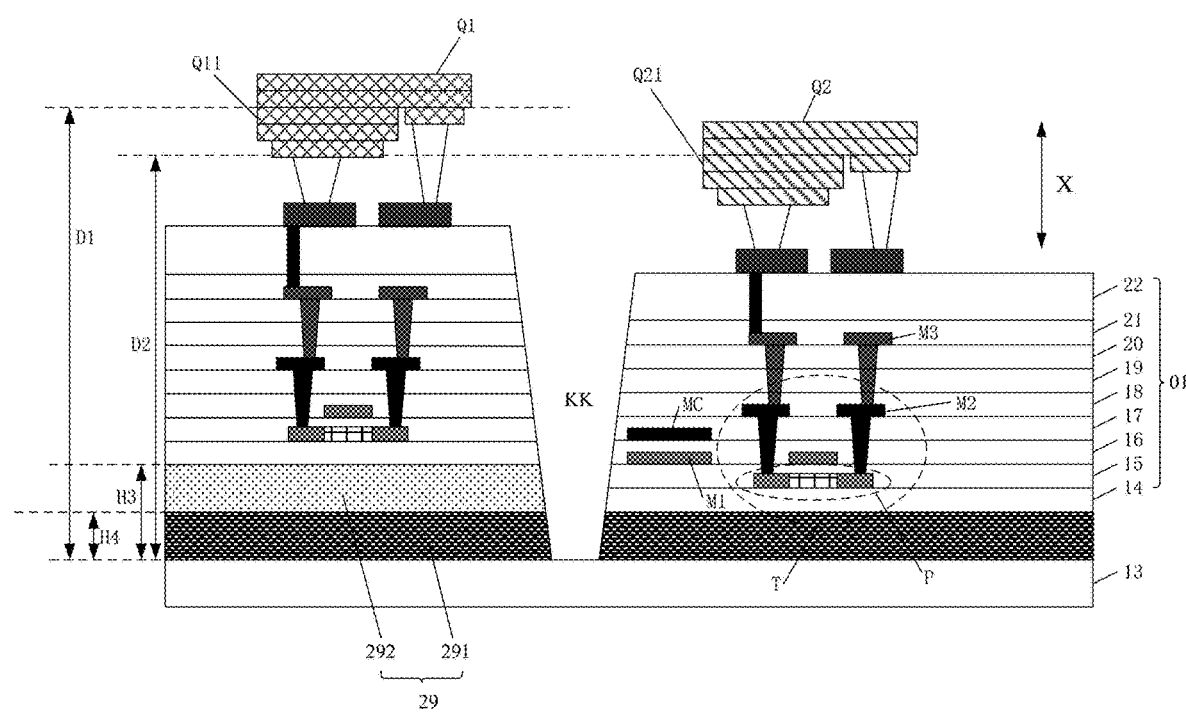
FIG. 6 illustrates a cross-sectional view of another exemplary first display panel consistent with various disclosed embodiments in the present disclosure.

In one embodiment shown in FIG. 6 which is a schematic cross-sectional view of another first display panel, the second film layer 29 may include a first sub-film layer 291 and a second sub-film layer 292.

As shown in FIG. 6, a thickness of a portion of the first sub-layer 291 overlapping the first light-emitting unit Q1 in the first direction X may be equal to a thickness of another portion of the first sub-layer 291 overlapping the second light-emitting unit Q2. In the first direction X, the first light-emitting unit Q1 and the second sub-film layer 292 may overlap, and the second light-emitting unit Q2 and the second sub-film layer 292 may not overlap.

That is, the second film layer 29 in the structure of the first display panel 11 shown in FIG. 6 may be formed by combining two sub-film layers.

Or, in another embodiment shown in FIG. 5, in the first direction X, the first light-emitting unit Q1 and the second film layer 29 may overlap, and the second light-emitting unit Q2 and the second film layer 29 may not overlap.

That is, only the film layer structure in the area where the first light-emitting unit Q1 is located may be improved and the second film layer 29 may be added. No film layer may be added in the area where the second light-emitting unit Q2 is located. Therefore, the first light-emitting unit Q1 may be raised, ensuring that the light emitted by the first light-emitting unit Q1 is more easily to be used by the second display panel 12 for reflective display to further improve the display effect of the second display panel 12 in a slightly dim or dark use environment.

Further, the forming method of the second film layer 29 in the present disclosure is flexible and may adopt any suitable method according to actual needs. The second film layer 29 may be disposed between the first substrate 13 and the array layer 01, instead of a new film layer added in the array layer 01. Therefore, forming the second film layer 29 may have no influence on the array layer 01, and may not increase the forming difficulty of the first display panel 11.

Figure 7:
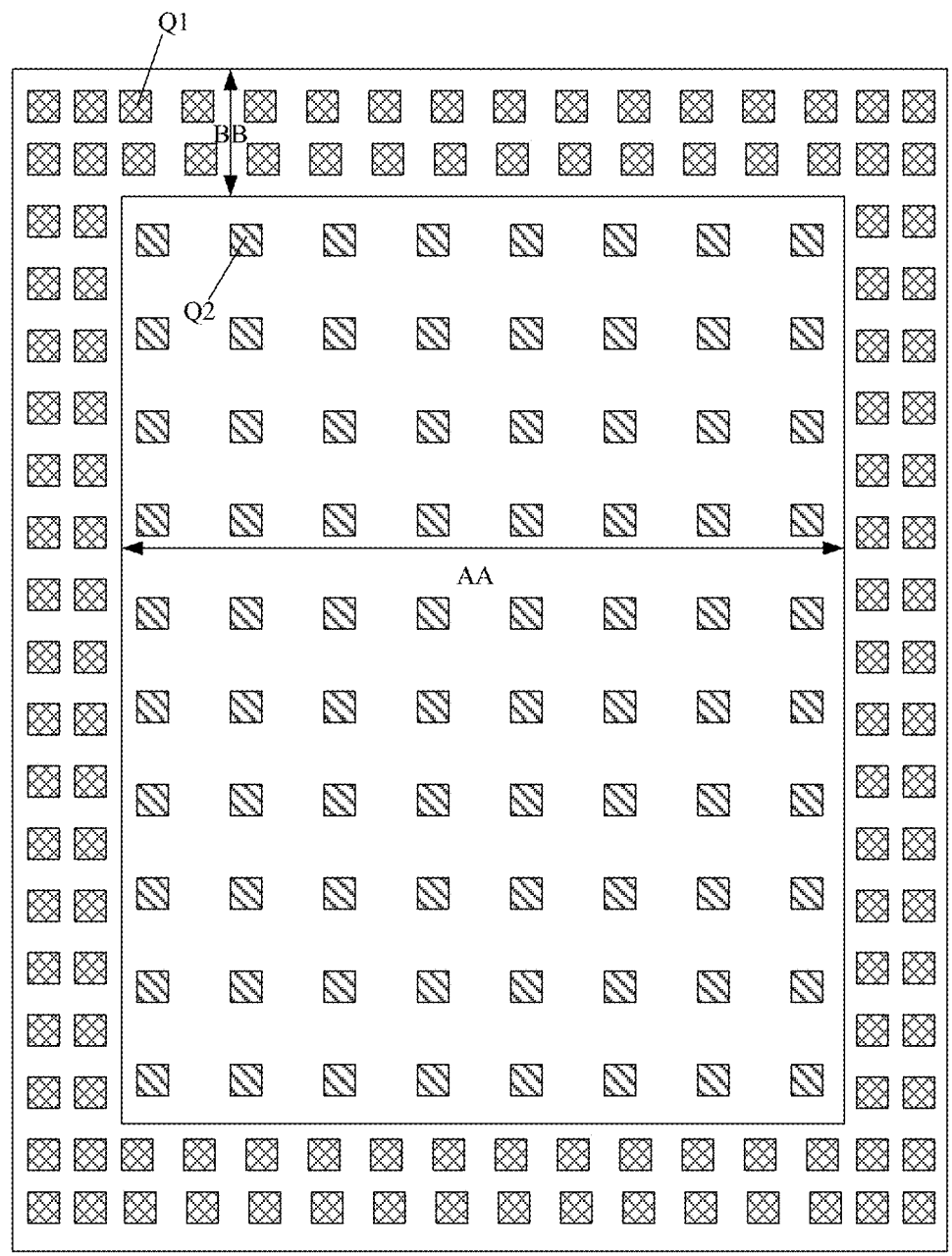
FIG. 7 illustrates a top view of an exemplary first display panel consistent with various disclosed embodiments in the present disclosure.

In another embodiment shown in FIG. 7 which is a top view of the display panel, the first display panel 11 may include a display area AA and a lighting area BB at least partially surrounding the display area AA.

The first light-emitting unit Q1 may be located in the lighting area BB, and the second light-emitting unit Q2 may be located in the display area AA.

As shown in FIG. 7, the embodiment where the illumination area BB completely surrounds the display area AA is used as an example for illustration. The first light-emitting unit Q1 may be located in the lighting area BB, and the second light-emitting unit Q2 may be located in the display area AA. That is, in the present embodiment, the first light-emitting unit Q1 may be mainly used to provide enough light when the second display panel 12 performs display and the ambient light is not ideal, to improve the display effect of the second display panel 12. The second light-emitting unit Q2 may be mainly used for color display of the first display panel 11.

Based on this, the driving modes of the first light-emitting unit Q1 and the second light-emitting unit Q2 may be different. To improve the display effect of the first display panel 11, the driving mode of the second light-emitting unit Q2 may be active driving. When the first display panel 11 has a good display effect, to simplify the driving mode of the first light-emitting unit Q1 in the lighting area BB, the driving mode of the first light-emitting unit Q1 may be passive driving.

Figure 8:
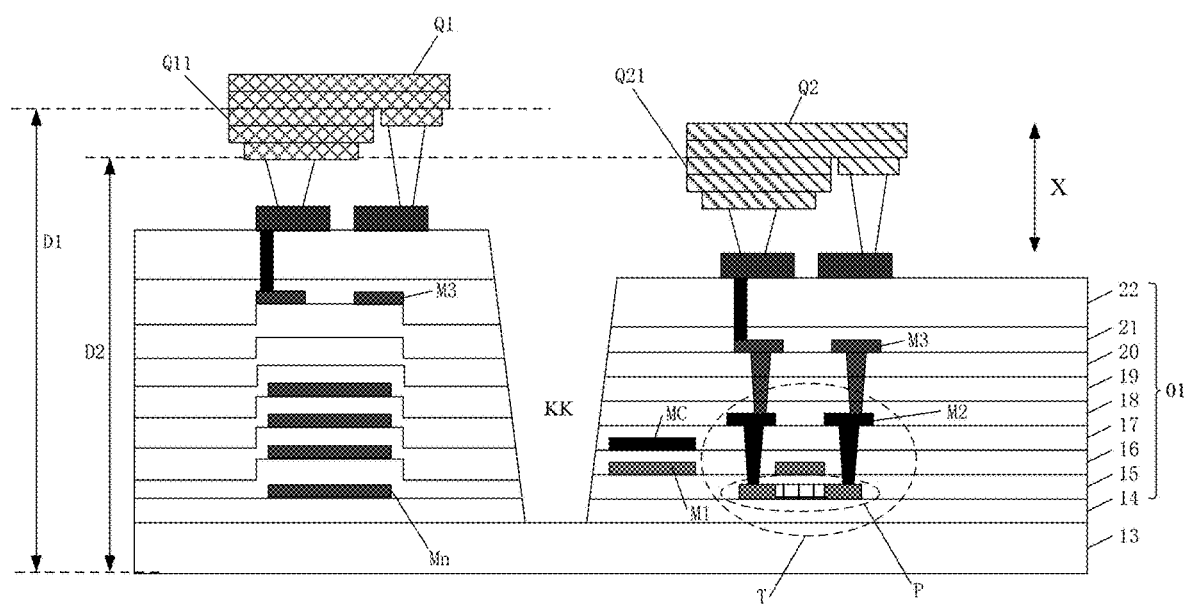
FIG. 8 illustrates a cross-sectional view of another exemplary first display panel consistent with various disclosed embodiments in the present disclosure.

As shown in FIG. 8 which is another schematic cross-sectional view of the first display panel, the first light-emitting unit Q1 may use a passive driving manner to control its working state, and the second light-emitting unit Q2 may use an active driving manner to control its working state.

As shown in FIG. 8, the first light-emitting unit Q1 in the passive driving mode may be not electrically connected to the thin film transistors T, but receive electrical signals through the third metal layer M3. In the present embodiment, to raise the first light-emitting unit Q1, a plurality of metal pad layers Mn may be disposed in the array layer overlapping and under the first light-emitting unit Q1. The distance between the first light-emitting layer Q11 of the first light-emitting unit Q1 in the first display panel 11 and the first substrate 13 in the first direction X may be made larger than the distance between the second light-emitting layer Q21 of the second light-emitting unit Q2 and the first substrate 13 in the first direction X through the plurality of metal pad layers Mn. That is, the height of the first light-emitting unit Q1 of the first substrate 13 may be higher than the height of the second light-emitting unit Q2, to ensure that the light emitted by the first light-emitting unit Q1 is more easily used by the second display panel 12 for reflective display and further improve the display effect of the second display panel 12 in a slightly dim or dark use environment.

It should be noted that, for description purposes only, the embodiment with four metal backing layers Mn is used as an example for illustrating the present disclosure, and does not limit the scope of the present disclosure. In some optional embodiments, the second light-emitting unit Q2 may not overlap the thin film transistors T, further increasing the height difference with the first light-emitting unit Q1.

In another embodiment, the transmittance of the display area AA may be larger than the transmittance of the illumination area BB.

When the second display panel 12 performs display when the external ambient light is not ideal, the display may be mainly realized by reflecting the light emitted by the first light-emitting unit Q1. Therefore, to ensure that the light emitted by the first light-emitting unit Q1 can be effectively used by the second display panel 12 for reflective display, in one embodiment, the transmittance of the display area AA may be set larger than the transmittance of the illumination area BB such that the light emitted by the first light-emitting unit Q1 is able to pass through the display area AA of the first display panel 11 more easily.

It can be seen from the above description that the display device provided by the embodiments of the present disclosure may mainly include three display modes, that is, a first display mode, a second display mode, and a third display mode. The three display modes are introduced one by one below.

In the first display mode, the first display panel 11 may perform display and the second display panel 12 may not display. In the first display mode, the first light-emitting unit Q1 may be in a non-light-emitting state, and the second light-emitting unit Q2 may be in a light-emitting state. That is, the first display panel 11 may perform display based on the second light-emitting unit Q2. The second light-emitting unit Q2 in the first display panel 11 may at least include a red-light second light-emitting, a green-light second light-emitting unit, and a blue-light second light-emitting unit, such that the first display panel 11 is able to perform color display.

In the second display mode, the first display panel 11 may not display, and the second display panel 12 may display. In the second display mode, the first light-emitting unit Q1 may be in a light-emitting state, and the second light-emitting unit Q2 may be in a non-light-emitting state. That is, when the display device does not need to perform color display, for example, when only text display is required, since the red-light light-emitting unit has a large power consumption during long-term display, only the second display panel 12 may need to display. When the ambient light is not ideal or the display effect of the second display panel 12 needs to be further improved, the first light-emitting unit Q1 may be in the light-emitting state to provide sufficient light for the reflection display of the second display panel 12.

In the third display mode, the first display panel 11 and the second display panel 12 may display at the same time. In the third display mode, the first light-emitting unit Q1 and the second light-emitting unit Q2 may be in a light-emitting state at the same time. For example, the color dynamic display may be performed by the first display panel 11 in a partial area of the display device, and text display may be performed by the second display panel 12 in some other areas of the display device.

In the present embodiment, when the first display panel 11 needs to display, the second light-emitting unit Q2 may be always in a working state. When the second display panel 12 needs to display, whether the first light-emitting unit Q1 needs to be in a working state may be judged based on the ambient light conditions. For example, the first light-emitting unit Q1 may be in a working state or not when the ambient light meets the display requirements of the second display panel 12, and the first light-emitting unit Q1 may always in a working state when the ambient light does not meet the display requirements of the second display panel 12.

In another embodiment, in the second display mode and/or the third display mode, the luminous intensity per unit area in the lighting area BB may be larger than the luminous intensity per unit area in the display area AA.

In the present embodiment, in the second display mode and/or in the third display mode, the brightness of the lighting area BB may be larger than the brightness of the display area AA where the brightness refers to a ratio of the light intensity and light emission of one light-emitting unit Q with a unit of candela/square meter (cd/m2), to ensure that the second display panel 12 may better receive the light emitted by the first light-emitting unit Q1 in the lighting area BB, thereby improving the display effect of the second display panel 12.

In another embodiment as shown in FIG. 7, the arrangement density of the first light-emitting unit Q1 may be larger than the arrangement density of the second light-emitting unit Q2.

By arranging more first light-emitting units Q1 in the lighting area BB, the arrangement density of the first light-emitting unit Q1 may be larger than the arrangement density of the second light-emitting unit Q2, to ensure that the lighting area BB is able to emit stronger light as a whole and improve the overall brightness of the lighting area BB. Correspondingly, the second display panel 12 may better receive the light emitted by the first light-emitting unit Q1 in the lighting area BB, thereby improving the display effect of the second display panel 12.

In another embodiment, the orthographic projection area of the first light-emitting layer on the first substrate 13 may be larger than the orthographic projection area of the second light-emitting layer on the first substrate 13.

The first light-emitting unit Q1 with a larger size may be arranged in the lighting area BB, and the second light-emitting unit Q2 with a relatively small size may be arranged in the display area AA. For example, a Mini-LED light-emitting unit may be arranged in the lighting area BB, and a Micro-LED light-emitting unit is arranged in the display area AA, to ensure that the lighting area BB is able to emit stronger light as a whole and improve the overall brightness of the lighting area BB. Correspondingly, the second display panel 12 may better receive the light emitted by the first light-emitting unit Q1 in the lighting area BB, thereby improving the display effect of the second display panel 12.

Figure 9:
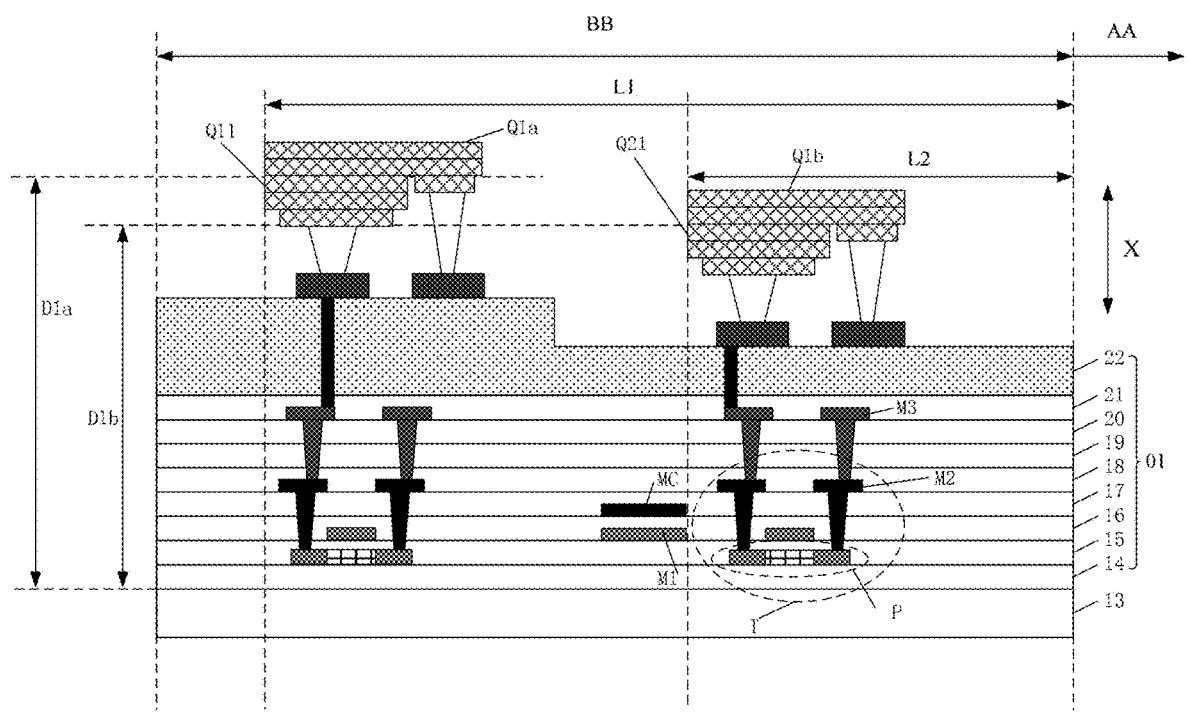
FIG. 9 illustrates a cross-sectional view of another exemplary first display panel consistent with various disclosed embodiments in the present disclosure.

In another embodiment shown in FIG. 9 which is another schematic cross-sectional view of the first display panel, the first light-emitting unit Q1 may include a first A light-emitting unit Q1a and a first B light-emitting unit Q1b.

In the direction from the lighting area BB to the display area AA, the distance between the first A light-emitting unit Q1a and the display area AA is L1, and the distance between the first B light-emitting unit Q1b and the display area AA is L2.

The distance between the first light-emitting layer of the first A light-emitting unit Q1a and the first substrate 13 in the first direction X is D1a.

The distance between the first light-emitting layer of the first B light-emitting unit Q1b and the first substrate 13 in the first direction X is D1b, where L1>L2, D1a>D1b.

In the present embodiment, in the direction from the lighting area BB the display area AA, when the first light-emitting units Q1 in the lighting area BB is closer to the display area AA, the distance between the first light-emitting layer and the first substrate 13 may be smaller, to prevent the light emitted by the first light-emitting units Q1 on the side far from the display area AA from being blocked by the first light-emitting units Q1 on the side close to the display area AA, thereby ensuring the light emitted by all the first light-emitting units Q1 in the lighting area BB may be effectively used by the second display panel 12 for reflective display. The display effect of the second display panel 12 may be improved correspondingly.

It should be noted that, to achieve the purpose of the embodiment shown in FIG. 9, the first film layer and the second film layer may be modified, or some other new film layers may be added, such that the first light emission units Q1 in the lighting area BB are arranged according to height requirements based on the first substrate 13.

It should be noted that, the embodiment shown in FIG. 9 with the improvement of the first film layer is used as an example for description, and the first film layer is described by taking the planarization layer 22 in the array layer 01 as an example.

Figure 10:
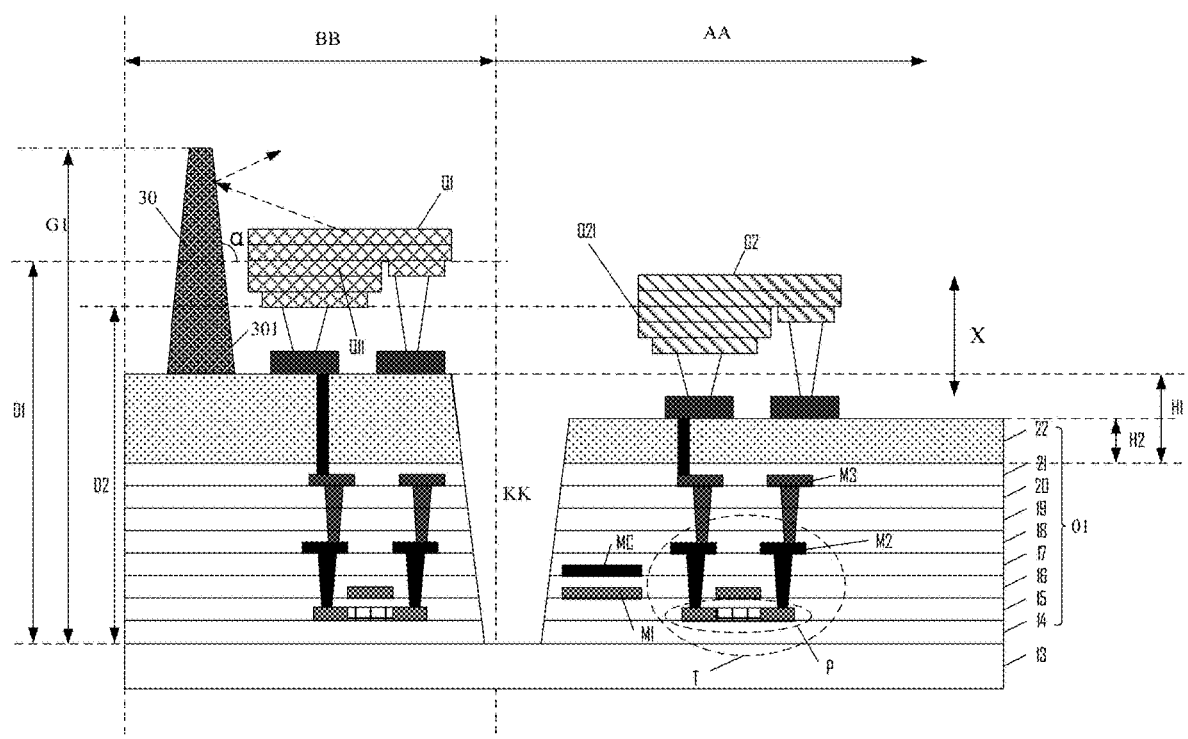
FIG. 10 illustrates another exemplary first display panel consistent with various disclosed embodiments in the present disclosure.

In another embodiment shown in FIG. 10 which is another schematic structural diagram of the first display panel, the first display panel 11 may further include a first component 30 located on the side of the first light-emitting unit Q1 away from the display area AA.

The first component 30 may include a first reflection surface 301 facing the first light-emitting unit Q1.

In the first direction X, the maximum distance between the first reflection surface 301 and the first substrate 13 is G1, where G1>D1.

The angle α between the plane where the first reflection surface 301 is located and the plane where the first light-emitting layer Q11 is located may be larger than 90°.

In the present embodiment, the first component 30 may be disposed in the edge area of the lighting area BB away from the display area AA. The light emitted by the first light-emitting unit Q1 in a direction away from the display area AA may be reflected by the first reflective surface 301 of the first component 30, such that the light emitted by the first light-emitting unit Q1 is emitted toward the area where the display area AA is located as much as possible and is utilized by the second display panel 12 for reflective display to the greatest extent.

It should be noted that the first component 30 may be a structure made of inorganic materials. By preparing a metal reflective layer on a surface of the first component 30 facing the first light-emitting unit Q1, the surface of the first component 30 facing the first light-emitting unit Q1 may have a reflective effect, forming the first reflective surface 301.

Figure 11:
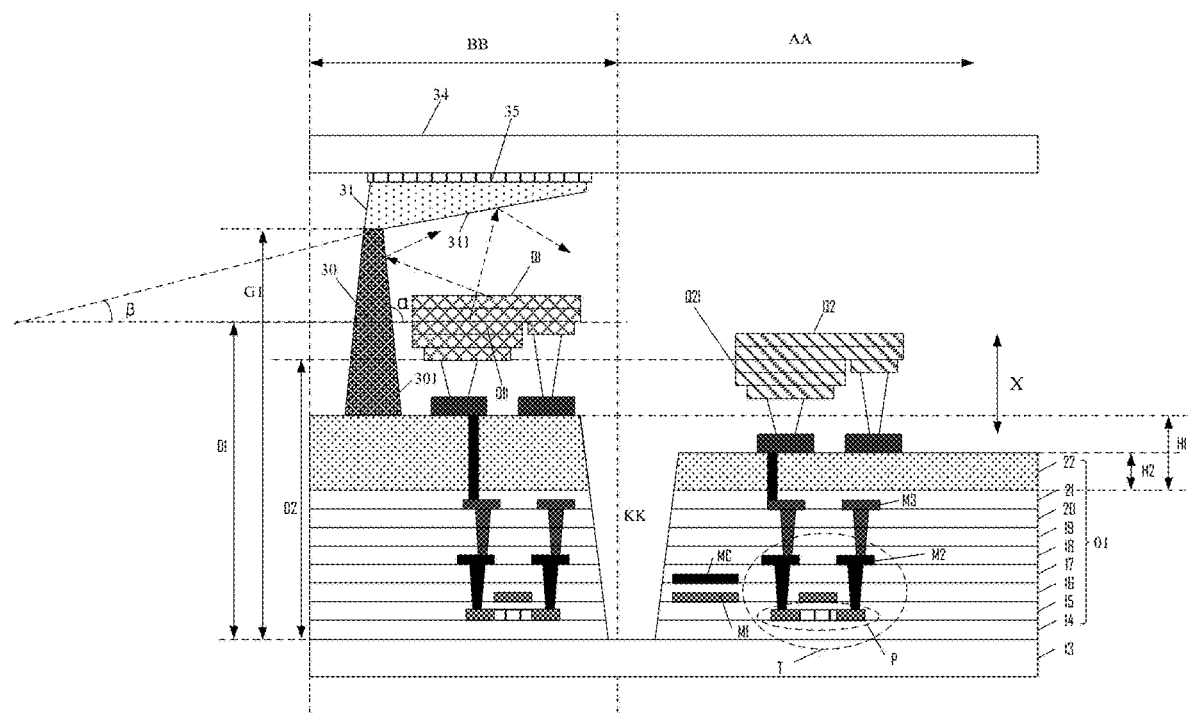
FIG. 11 illustrates another exemplary first display panel consistent with various disclosed embodiments in the present disclosure.

In another embodiment shown in FIG. 11 which is another schematic structural diagram of the first display panel, the first display panel 11 may further include a second component 31 located on the side of the first light-emitting unit Q1 away from the first substrate 13.

The second component 31 may include a second reflection surface 311 facing the first light-emitting unit Q1.

An orthographic projection of the second reflection surface 311 on the first substrate 13 may at least partially overlap the orthographic projection of the first light-emitting layer Q11 on the first substrate 13.

The angle β between the plane where the second reflection surface 311 is located and the plane where the first light-emitting layer Q11 is located may be smaller than 90°.

In the present embodiment, the second component 31 may be disposed at a side of the first light-emitting unit Q1 away from the first substrate 13. The light emitted by the first light-emitting unit Q1 in a direction away from the display area AA may be reflected by the second reflective surface 311 of the second component 31, such that the light emitted by the first light-emitting unit Q1 is emitted toward the area where the display area AA is located as much as possible and is utilized by the second display panel 12 for reflective display to the greatest extent.

It should be noted that the second component 31 may be a structure made of inorganic materials. By preparing a metal reflective layer on a surface of the second component 31 facing the first light-emitting unit Q1, the surface of the second component 31 facing the first light-emitting unit Q1 may have a reflective effect, forming the second reflective surface 311.

Figure 12:
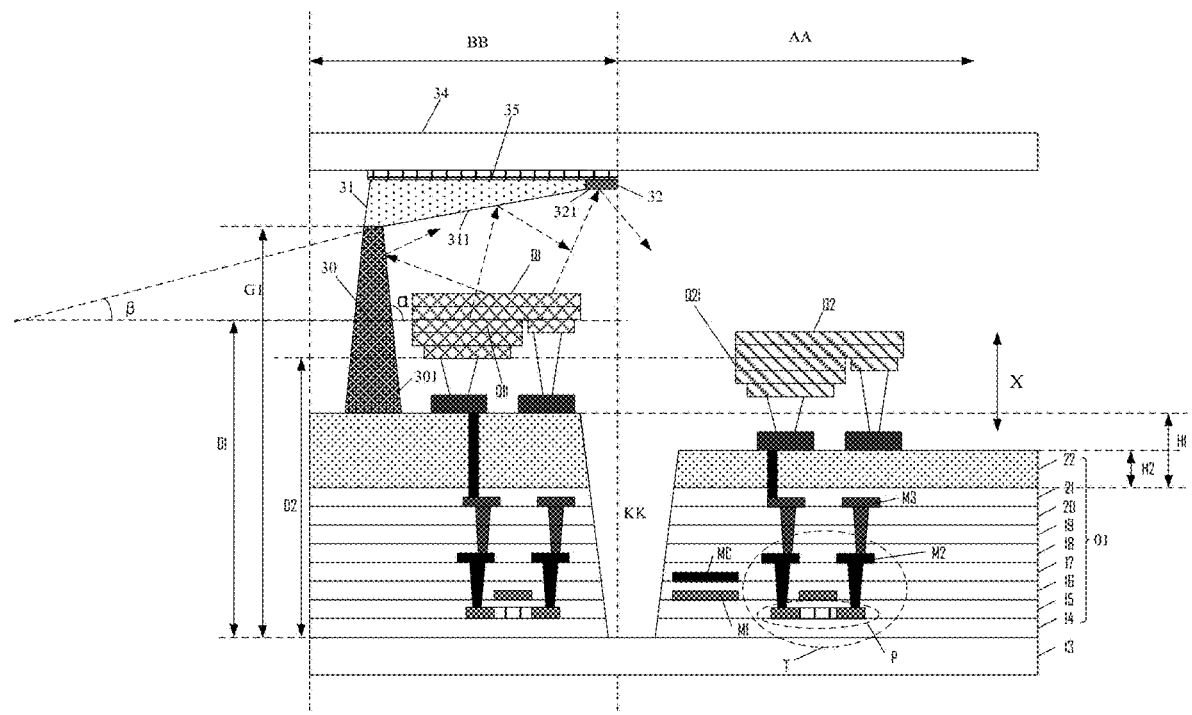
FIG. 12 illustrates another exemplary first display panel consistent with various disclosed embodiments in the present disclosure.

In another embodiment shown in FIG. 12 which is another schematic structural diagram of the first display panel, the first display panel 11 may further include a third component 32 located on the side of the first light-emitting unit Q1 away from the first substrate 13.

The third component 32 may include a third reflection surface 321 facing the first light-emitting unit Q1.

At least a portion of an orthographic projection of the third reflection surface 321 on the first substrate 13 may not overlap the orthographic projection of the first light-emitting layer Q11 on the first substrate 13. Along the direction from the first light-emitting unit Q1 to the second light-emitting unit Q2, the third reflective surface 321 may be at least partially located on the side of the first light-emitting unit Q1 close to the second light-emitting unit Q2.

In the present embodiment, the third component 32 may be disposed at the side of the first light-emitting unit Q1 away from the first substrate 13. The light emitted by the first light-emitting unit Q1 in a direction away from the display area AA may be reflected by the third reflective surface 321 of the third component 32, such that the light emitted by the first light-emitting unit Q1 is emitted toward the area where the display area AA is located as much as possible and is utilized by the second display panel 12 for reflective display to the greatest extent.

It should be noted that the third component 31 may be a structure made of inorganic materials. By preparing a metal reflective layer on a surface of the third component 32 facing the first light-emitting unit Q1, the surface of the third component 32 facing the first light-emitting unit Q1 may have a reflective effect, forming the third reflective surface 321.

It should be noted that, in the first display panel provided by various embodiments shown in FIGS. 10-12, any one of the first component 30, the second component 31 and the third component 32 may be provided independently. Or three components may be provided at the same time. Or two of the three components may be provided at the same time. The present disclosure has no limit on this. The embodiment with the optimal solution where the three components are provided at the same time is used as an example to illustrate the present disclosure.

When the first component 30, the second component 31 and the third component 32 are provided at the same time, the light emitted by the first light-emitting unit Q1 may be utilized by the second display panel 12 to the maximum extent, to improve the display effect of the display panel 12.

It should be noted that the first display panel 11 may further include a second substrate 34 arranged opposite to the first substrate 13. The second component 31 and the third component 32 may be disposed on a side of the second substrate 34 facing the first substrate 13. Inorganic layers 35 may be provided between the second member 31 and the second substrate 34 and between the third member 32 and the second substrate 34.

Figure 13:
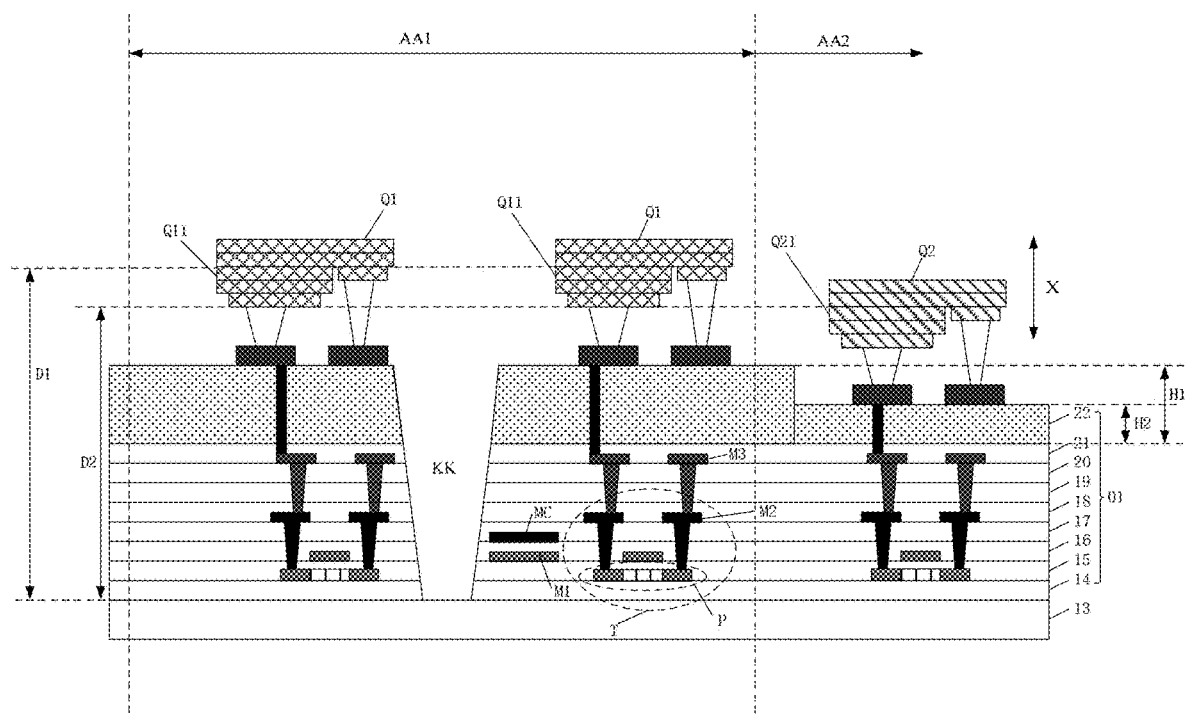
FIG. 13 illustrates a cross-sectional view of another exemplary first display panel consistent with various disclosed embodiments in the present disclosure.
Figure 14:
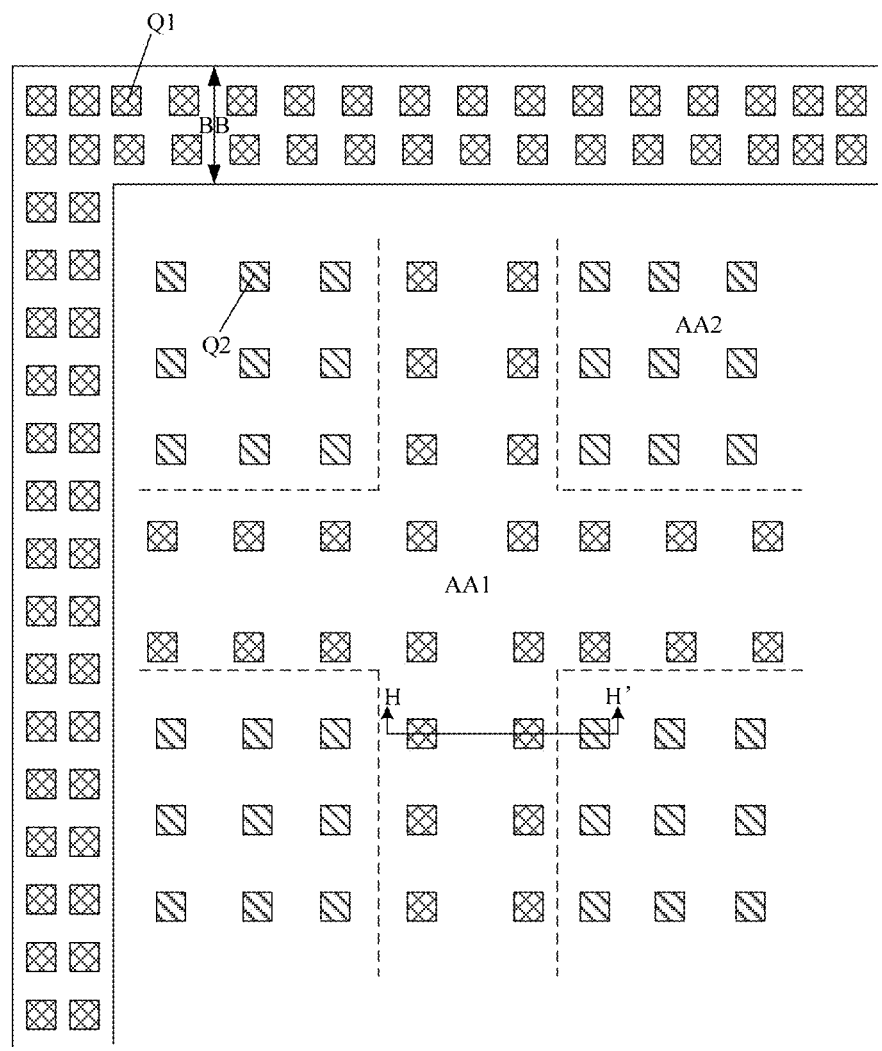
FIG. 14 illustrates a top view of another exemplary first display panel consistent with various disclosed embodiments in the present disclosure.

In another embodiment shown in FIG. 13 which is another schematic cross-sectional view of the first display panel and FIG. 14 which is another top view of the first display panel, the first display panel 11 may include a display area AA and the display area AA may include a first display area AA1 and a second display area AA2 at least partially surrounding the first display area AA1. The transmittance of the first display area AA1 may be larger than the transmittance of the second display area AA2.

The first light-emitting unit Q1 may be located in the first display area AA1, and the second light-emitting unit Q2 may be located in the second display area AA2.

A distance between two adjacent first light-emitting units Q1 in the first display area AA1 may be larger than a distance between two adjacent second light-emitting units Q2 in the second display area AA2.

As shown in FIG. 14, the second light-emitting units Q2 mainly used for color display may be disposed in the display area AA of the first display panel 11, and some raised first light-emitting units Q1 mainly used for providing light may be also disposed in the display area AA of the first display panel 11. The first light-emitting units Q1 located in the first display area AA1 may be arranged around the edge area of the first display area AA1, and the light emitted by these first light-emitting units Q1 may more easily pass through the first display panel 11 to be utilized by the second display panel 12 for reflective display.

That is, in the display device shown in FIG. 14, the first light-emitting units Q1 may be provided in the lighting area BB, and the first light-emitting units Q1 may be also provided in the first display area AA1 of the display area. When the first light-emitting units Q1 are in the working state, the second display panel 12 may simultaneously receive the light emitted by the first light-emitting units Q1 in the lighting area BB and the light emitted by the first light-emitting units Q1 in the first display area AA1, to maximize the improvement of the reflective display effect of the second display panel 12.

Figure 15:
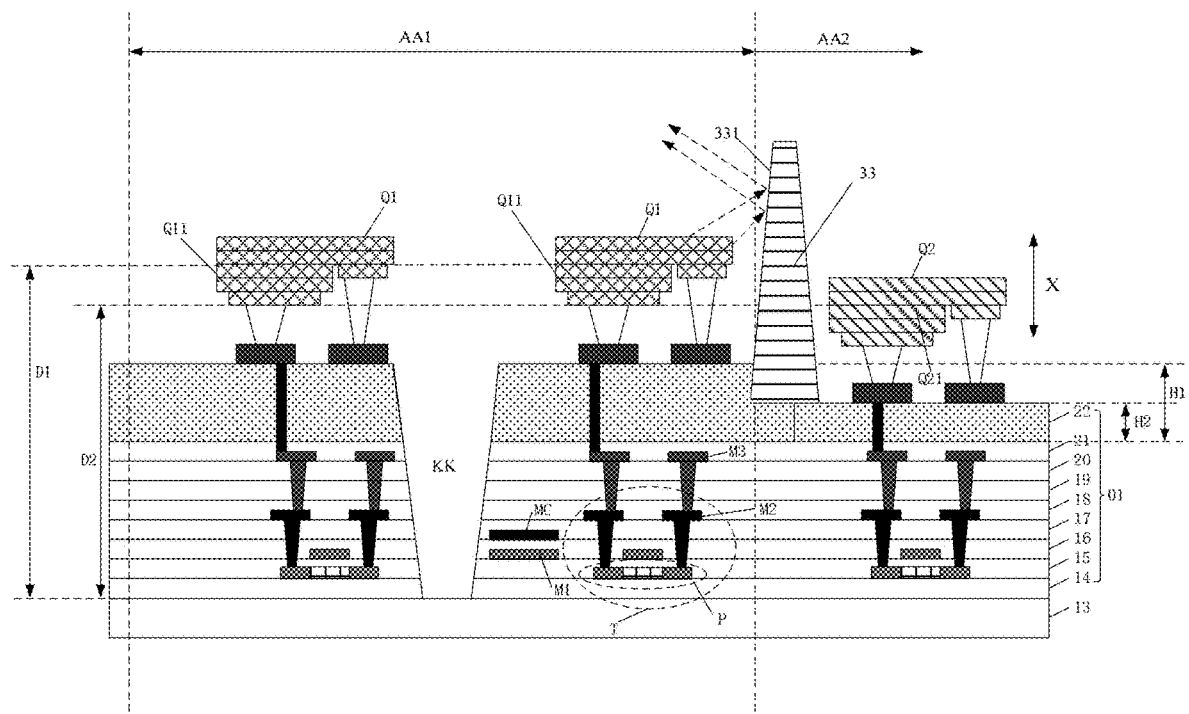
FIG. 15 illustrates a cross-sectional view of the first display panel in FIG. 14 along an HH' direction, consistent with various disclosed embodiments in the present disclosure.

In another embodiment shown in FIG. 15 which is a schematic cross-sectional view along the HH' direction in FIG. 14, a barrier wall 33 may be disposed between one first light-emitting unit Q1 and one corresponding second light-emitting unit Q2 in the display area AA.

The barrier wall 33 may include a fourth reflection surface 331, and the fourth reflection surface 331 may be located on a side of the barrier wall 33 facing one corresponding first light-emitting unit Q1.

In the present embodiment, the barrier wall 33 may be disposed between one first light-emitting unit Q1 and one corresponding second light-emitting unit Q2 in the display area AA. The light emitted by the first light-emitting units Q1 in a direction away from the display area AA may be reflected by the fourth reflective surface 331 of the barrier wall 33, such that the light emitted by the first light-emitting unit Q1 is emitted toward the area where the display area AA is located as much as possible and is utilized by the second display panel 12 for reflective display to the greatest extent.

It should be noted that the barrier wall 33 may be a structure made of inorganic materials. By preparing a metal reflective layer on a surface of the barrier wall 33 facing the first light-emitting unit Q1, the surface of the barrier wall 33 facing the first light-emitting unit Q1 may have a reflective effect, forming the fourth reflective surface 331.

Figure 16:
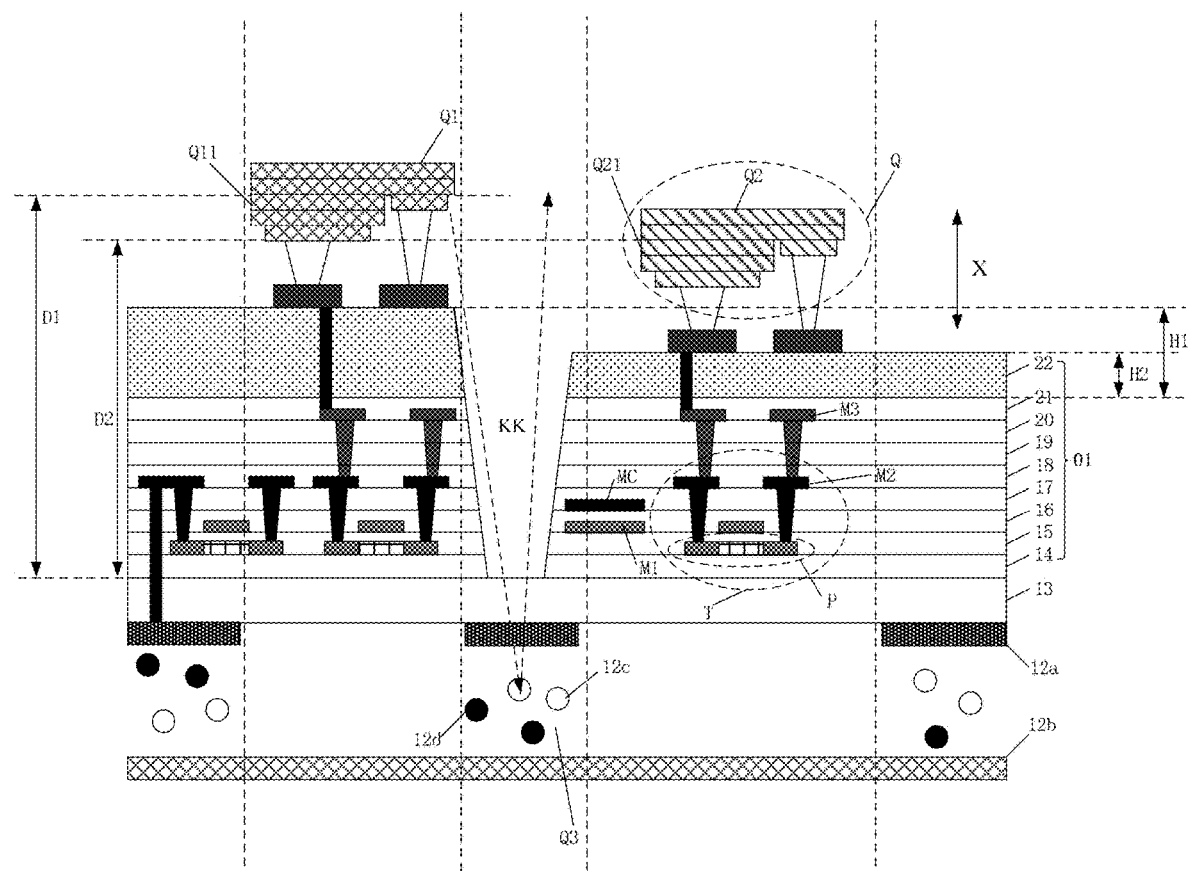
FIG. 16 illustrates a cross-sectional view of another exemplary display device consistent with various disclosed embodiments in the present disclosure.

In another embodiment shown in FIG. 16 which is a schematic cross-sectional view of the display device, the pixel definition layer 12a may include a plurality of independent pixel units, the second display panel 12 may include third light-emitting units Q3, and the third light-emitting units Q3 may be understood as the minimum light-emitting area formed by each of the plurality of independent pixel units and the area facing the common electrode layer 12b.

The third light-emitting units Q3 in the second display panel 12 may not overlap the light-emitting units Q in the first display panel 11.

To avoid the influence of the light-emitting units in the first display panel 11 on the display of the second display panel 12, the third light-emitting units Q3 in the second display panel 12 and the light-emitting units Q in the first display panel 11 may not overlap, to improve the display effect of the second display panel 12.

Figure 17:
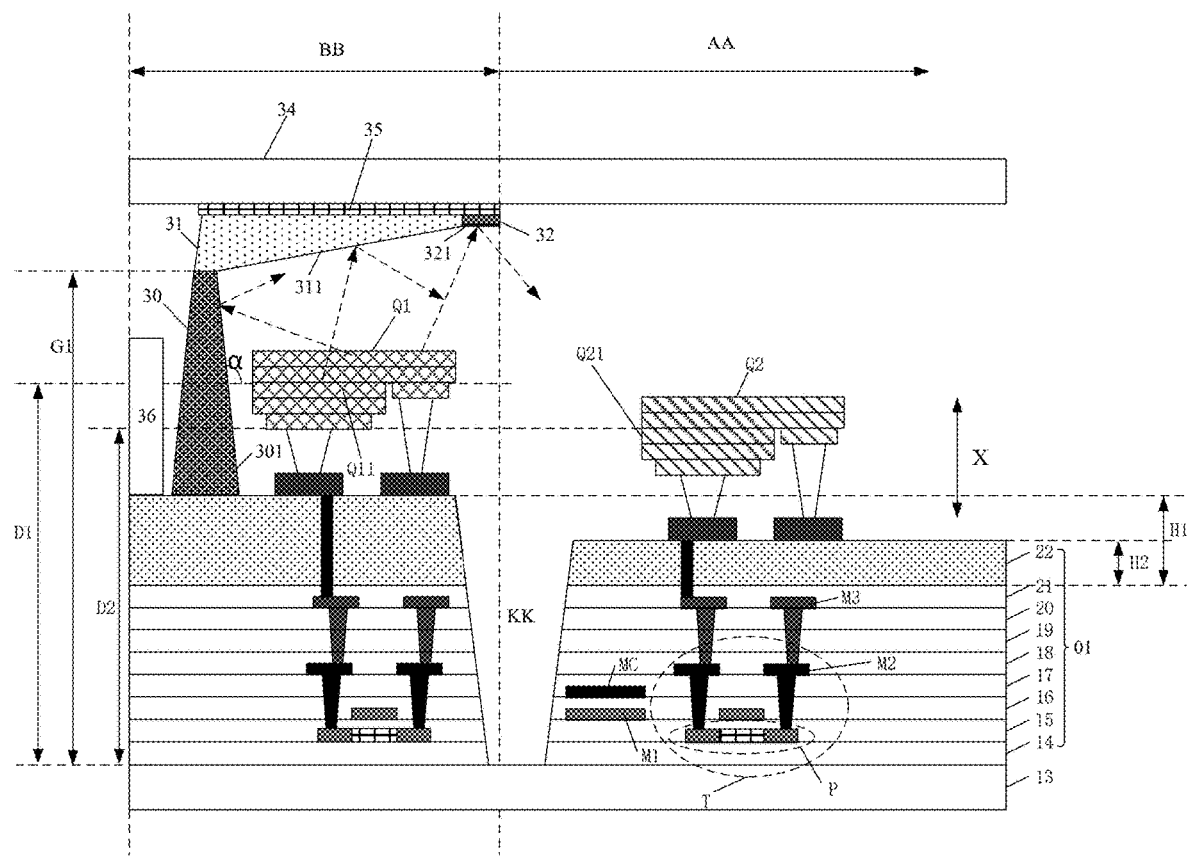
FIG. 17 illustrates a cross-sectional view of another exemplary first display panel consistent with various disclosed embodiments in the present disclosure.

In another embodiment shown in FIG. 17 which is another schematic cross-sectional view of the first display panel, the first display panel 11 may further include a light sensor 36 located on the side of the first light-emitting units Q1 away from the second light-emitting units Q2.

The light sensor 36 may be used to detect ambient light in the space where the display device is located.

The light sensor 36 may be located on the side of the lighting area BB away from the display area AA, and may be configured to control the working state and luminous intensity of the first light-emitting units Q1 by detecting the ambient light in the space where the display device is located.

In one embodiment, the display device may further include an operational amplifier, an analog-to-digital conversion circuit, and a driver chip. When the light sensor 36 detects a change in the ambient light in the space where the display device is located, it may convert the collected optical signal into an electrical signal and transmit it to the operational amplifier. The gain of the electrical signal may be realized through the operational amplifier and the analog/digital conversion circuit, and then the driver chip may adjust its own output signal based on the received electrical signal, to realize the control of the light-emitting units Q such as adjusting the brightness of the light-emitting units Q to increase or decrease the brightness of the light-emitting unit Q.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display device, comprising a first display panel and a second display panel stacked in a first direction, wherein:
   the first display panel includes a first substrate and light-emitting units on a side of the first substrate away from the second display panel;
   the light-emitting units include first light-emitting units and second light-emitting units;
   one first light-emitting unit includes a first light-emitting layer, and a distance between the first light-emitting layer and the first substrate in the first direction is D1;
   one second light-emitting unit includes a second light-emitting layer, and a distance between the second light-emitting layer and the first substrate in the first direction is D2, wherein D1>D2; and
   the second display panel includes a reflective surface on a side of the first substrate away from the light-emitting units, wherein:
   the first display panel further includes an array layer between the first substrate and the light-emitting units;
   the array layer includes a first film layer; and
   a thickness of a portion of the first film layer overlapping the first light-emitting units is larger than a thickness of another portion of the first film layer overlapping the second light-emitting units.

2. The display device according to claim 1, wherein:
   the first display panel includes a display area and an illumination area at least partially surrounding the display area; and
   the first light-emitting units are located in the illumination area, and the second light-emitting units are located in the display area.

3. The display device according to claim 2, wherein: a transmittance of the display area is larger than a transmittance of the illumination area.

4. The display device according to claim 2, wherein:
   an arrangement density of the first light-emitting units is larger than an arrangement density of the second light-emitting units.

5. The display device according to claim 2, wherein an orthographic projection area of the first light-emitting layer on the first substrate is larger than an orthographic projection area of the second light-emitting layer on the first substrate.

6. The display device according to claim 2, wherein:
   first light-emitting units include a first light-emitting element A and a first light-emitting element B;
   in a direction from the illumination area to the display area, a distance between the first light-emitting element A and the display area is L1, and a distance between the first light-emitting element B and the display area is L2;
   a distance between the first light-emitting layer of the first light-emitting element A and the first substrate in the first direction is D1a; and
   a distance between the first light-emitting layer of the first light-emitting element B and the first substrate in the first direction is D1b,
   wherein L1>L2 and D1a>D1b.

7. The display device according to claim 2, wherein:
   the first display panel further includes a first component located on a side of one corresponding first light-emitting unit away from the display area;
   the first component includes a first reflective surface facing the corresponding first light-emitting unit;
   in the first direction, a maximum distance between the first reflective surface and the first substrate is G1, wherein G1 is greater than a distance between the first light-emitting layer and the first substrate in the first direction;
   an angle between the plane where the first reflective surface is located and the plane where the first light-emitting layer is located is larger than 90°.

8. The display device according to claim 2, wherein:
   the first display panel further includes a second component located on a side of one corresponding first light-emitting unit away from the first substrate;
   the second component includes a second reflective surface facing the corresponding first light-emitting unit;
   an orthographic projection of the second reflective surface on the first substrate at least partially overlaps the orthographic projection of the first light-emitting layer on the first substrate; and
   an angle between the plane where the second reflective surface is located and the plane where the first light-emitting layer is located is smaller than 90°.

9. The display device according to claim 2, wherein:
   the first display panel further includes a third component located on a side of one corresponding first light-emitting unit away from the display area;
   the third component includes a third reflective surface facing the corresponding first light-emitting unit;
   at least a portion of an orthographic projection of the third reflective surface on the first substrate does not overlap the orthographic projection of the first light-emitting layer on the first substrate; and
   in a direction from the first light-emitting unit to one corresponding second light-emitting unit, the third reflective surface is at least partially located at a side of the first light-emitting unit close to the second light-emitting unit.

10. The display device according to claim 1, wherein:
    the first display panel further includes another array layer between the first substrate and the light-emitting units, and a second film layer between the other array layer and the first substrate; and
    a thickness of a portion of the second film layer overlapping the first light-emitting units is larger than a thickness of another portion of the second film layer overlapping the second light-emitting units in the first direction, or the first light-emitting units overlap the second film layer in the first direction and the second light-emitting units do not overlap the second film layer.

11. The display device according to claim 1, wherein:
the first display panel includes a display area;
the display area includes a first display area and a second display area at least partially surrounding the first display area;
a transmittance of the first display area is larger than a transmittance of the second display area; and
the first light-emitting units located in the first display area and the second light-emitting units are located in the second display area.

12. The display device according to claim 11, wherein:
a barrier wall is disposed between one first light-emitting unit and one corresponding second light-emitting unit; and
the barrier wall includes a fourth reflective surface on a side of the barrier wall facing the first light-emitting unit.

13. The display device according to claim 1, wherein:
the first display panel further includes a light sensor located at a side of one first light-emitting unit away from one corresponding second light-emitting unit; and
the light sensor is used to detect ambient light in the space where the display device is located.

14. The display device according to claim 1, wherein:
a driving mode of the first light-emitting units is passive driving and a driving mode of the second light-emitting units is active driving.

15. A display device, comprising a first display panel and a second display panel stacked in a first direction, wherein:
the first display panel includes a display area and an illumination area at least partially surrounding the display area, and the first display panel further a first substrate and light-emitting units on a side of the first substrate away from the second display panel;
the light-emitting units include first light-emitting units located in the illumination area and second light-emitting units located in the display area;
one first light-emitting unit includes a first light-emitting layer, and a distance between the first light-emitting layer and the first substrate in the first direction is D1;
one second light-emitting unit includes a second light-emitting layer, and a distance between the second light-emitting layer and the first substrate in the first direction is D2, wherein D1>D2; and
the second display panel includes a reflective surface on a side of the first substrate away from the light-emitting units, wherein:
the display device has a first display mode, a second display mode, and a third display mode;
in the first display mode, the first display panel displays, and the second display panel does not display, wherein the first light-emitting units are in a non-light-emitting state and the second light-emitting units are in a light-emitting state;
in the second display mode, the first display panel does not display, and the second display panel displays, wherein the first light-emitting units are in a light-emitting state, and the second light-emitting units are in a non-light-emitting state; and
in the third display mode, the first display panel and the second display panel display simultaneously, wherein the first light-emitting units and the second light-emitting units are in a light-emitting state at the same time.

16. The display device according to claim 15, wherein:
in the second display mode and/or the third display mode, a luminous intensity per unit area in the illumination area is larger than a luminous intensity per unit area in the display area.

17. A display device, comprising a first display panel and a second display panel stacked in a first direction, wherein:
the first display panel includes a first substrate and light-emitting units on a side of the first substrate away from the second display panel;
the light-emitting units include first light-emitting units and second light-emitting units;
one first light-emitting unit includes a first light-emitting layer, and a distance between the first light-emitting layer and the first substrate in the first direction is D1;
one second light-emitting unit includes a second light-emitting layer, and a distance between the second light-emitting layer and the first substrate in the first direction is D2, wherein D1>D2;
the second display panel includes a reflective surface on a side of the first substrate away from the light-emitting units;
the second display panel further includes third light-emitting units that are configured as a minimum light-emitting area formed by a plurality of independent pixel units; and
the third light-emitting units in the second display panel do not overlap the light-emitting units in the first display panel.

18. The display device according to claim 1, wherein:
the second display panel includes a pixel electrode layer and a common electrode layer; and
the pixel electrode layer is located on a side of the common electrode layer close to the first display panel.

19. The display device according to claim 1, wherein:
the first light-emitting units are LED light-emitting units;
the second light-emitting units are LED light-emitting units or OLED light-emitting units; and
the second display panel is a reflective display panel.

* * * * *